United States Patent
Nakamura et al.

(10) Patent No.: US 7,815,424 B2
(45) Date of Patent: Oct. 19, 2010

(54) IMPRINTING MACHINE AND DEVICE MANUFACTURING METHOD

(75) Inventors: Takashi Nakamura, Tokyo (JP); Hirohisa Ota, Kawagoe (JP); Eigo Kawakami, Utsunomiya (JP); Kazuyuki Kasumi, Utsunomiya (JP); Toshinobu Tokita, Yokohama (JP)

(73) Assignee: Canon Kabushiki Kaisha (JP)

( * ) Notice: Subject to any disclaimer, the term of this patent is extended or adjusted under 35 U.S.C. 154(b) by 423 days.

(21) Appl. No.: 11/297,031

(22) Filed: Dec. 7, 2005

(65) Prior Publication Data

US 2006/0157444 A1    Jul. 20, 2006

(30) Foreign Application Priority Data

Dec. 9, 2004    (JP) ............................. 2004-356284

(51) Int. Cl.
    *B29C 59/02* (2006.01)
(52) U.S. Cl. ..................... 425/150; 425/171; 425/375; 425/385; 425/400; 425/419; 264/40.1; 264/293; 264/406; 264/496
(58) Field of Classification Search ................. 425/29, 425/105, 112, 149, 150, 375, 385, 139, 171, 425/419, 389, 400, 403, 398; 249/139; 264/40.1, 264/40.7, 107, 293, 401, 406, 496; 356/139.03, 356/139.04, 139.05, 139.06, 139.07, 399, 356/400, 401, 485, 486, 490, 498, 500, 620; 101/485, DIG. 36
See application file for complete search history.

(56) References Cited

U.S. PATENT DOCUMENTS

| | | | |
|---|---|---|---|
| 5,000,573 A | | 3/1991 | Suzuki et al. |
| 5,295,802 A | * | 3/1994 | Hersbt ....................... 425/139 |
| 5,413,018 A | * | 5/1995 | Wada et al. ..................... 83/456 |
| 5,772,905 A | * | 6/1998 | Chou ........................... 216/44 |
| 5,894,056 A | * | 4/1999 | Kakizaki et al. ............... 430/5 |
| 5,959,304 A | * | 9/1999 | Tokita et al. ............. 250/492.2 |
| 6,151,120 A | | 11/2000 | Matsumoto et al. |
| 6,285,033 B1 | | 9/2001 | Matsumoto |
| 6,309,580 B1 | * | 10/2001 | Chou ......................... 264/338 |
| 6,482,742 B1 | | 11/2002 | Chou |
| 6,517,977 B2 | | 2/2003 | Resnick et al. |
| 6,522,411 B1 | | 2/2003 | Moon et al. |
| 6,559,927 B1 | * | 5/2003 | Tokita et al. .................. 355/72 |
| 6,696,220 B2 | * | 2/2004 | Bailey et al. ................ 425/385 |

(Continued)

FOREIGN PATENT DOCUMENTS

JP    62-261003    11/1987

(Continued)

OTHER PUBLICATIONS

Extended European Search Report dated Mar. 20, 2009 issued in corresponding foreign application EP 05026844.0.

(Continued)

*Primary Examiner*—Steven P Griffin
*Assistant Examiner*—Seyed Masoud Malekzadeh
(74) *Attorney, Agent, or Firm*—Rossi, Kimms & McDowell LLP

(57) ABSTRACT

An imprinting machine that brings a mold having a pattern into contact with an object and transfers the pattern onto the object includes a measurement unit that measures a position of the mold when the mold contacts the object.

5 Claims, 12 Drawing Sheets

U.S. PATENT DOCUMENTS

| | | | |
|---|---|---|---|
| 6,741,358 B1 | 5/2004 | Kamiya | |
| 6,754,303 B2 * | 6/2004 | Kasumi | 378/34 |
| 6,836,316 B2 * | 12/2004 | Tokita | 355/72 |
| 6,859,303 B2 * | 2/2005 | Wang et al. | 359/321 |
| 6,875,384 B1 * | 4/2005 | Whitney | 264/40.5 |
| 6,876,438 B2 * | 4/2005 | Tokita | 355/72 |
| 6,916,584 B2 * | 7/2005 | Sreenivasan et al. | 430/22 |
| 6,939,120 B1 * | 9/2005 | Harper | 425/384 |
| 6,955,767 B2 * | 10/2005 | Chen | 216/40 |
| 6,972,844 B2 * | 12/2005 | Tokita | 356/401 |
| 6,987,830 B2 * | 1/2006 | Kasumi | 378/34 |
| 6,990,173 B1 * | 1/2006 | Kawakami et al. | 378/34 |
| 6,990,870 B2 * | 1/2006 | Choi et al. | 73/865.9 |
| 6,994,541 B2 * | 2/2006 | Chung et al. | 425/385 |
| 7,027,127 B2 * | 4/2006 | Kasumi | 355/53 |
| 7,144,539 B2 * | 12/2006 | Olsson | 264/293 |
| 7,195,734 B2 * | 3/2007 | Heidari | 264/667 |
| 7,241,395 B2 * | 7/2007 | Sreenivasan et al. | 216/54 |
| 7,279,046 B2 * | 10/2007 | Eby et al. | 118/695 |
| 7,292,326 B2 * | 11/2007 | Nimmakayala et al. | 356/139.04 |
| 7,323,130 B2 * | 1/2008 | Nimmakayala et al. | 264/319 |
| 7,329,114 B2 * | 2/2008 | Harper et al. | 425/385 |
| 2001/0035942 A1 * | 11/2001 | Hara et al. | 355/30 |
| 2002/0093122 A1 | 7/2002 | Choi et al. | |
| 2002/0098426 A1 * | 7/2002 | Sreenivasan et al. | 430/22 |
| 2002/0115002 A1 | 8/2002 | Bailey et al. | |
| 2002/0176096 A1 * | 11/2002 | Sentoku et al. | 356/620 |
| 2003/0020891 A1 * | 1/2003 | Tokita | 355/53 |
| 2003/0035508 A1 * | 2/2003 | Kasumi | 378/34 |
| 2003/0081213 A1 * | 5/2003 | Oishi et al. | 356/401 |
| 2003/0179354 A1 * | 9/2003 | Araki et al. | 355/53 |
| 2003/0213382 A1 | 11/2003 | Kendale et al. | |
| 2003/0230730 A1 * | 12/2003 | Tokita | 250/492.2 |
| 2004/0004701 A1 * | 1/2004 | Kasumi | 355/53 |
| 2004/0021866 A1 * | 2/2004 | Watts et al. | 356/401 |
| 2004/0200368 A1 | 10/2004 | Ogino et al. | |
| 2004/0257550 A1 * | 12/2004 | Kasumi | 355/53 |
| 2005/0064054 A1 * | 3/2005 | Kasumi | 425/112 |
| 2005/0105093 A1 * | 5/2005 | Tokita | 356/401 |
| 2005/0186716 A1 * | 8/2005 | Kasumi | 438/149 |
| 2006/0126058 A1 * | 6/2006 | Nimmakayala et al. | 356/139.04 |

FOREIGN PATENT DOCUMENTS

| | | |
|---|---|---|
| JP | 3-225646 A | 10/1991 |
| JP | 11-150063 | 6/1999 |
| JP | 11-162835 | 6/1999 |
| JP | 2000-194142 | 7/2000 |
| JP | 2002-251016 A | 9/2002 |
| JP | 2004-288845 A | 10/2004 |
| WO | 01/33300 A2 | 5/2001 |
| WO | 02/067055 A2 | 8/2002 |

OTHER PUBLICATIONS

Extended European Search Report issued in corresponding European Patent Application No. 10002526.1 dated May 7, 2010.

Notice of Reasons for Rejection issued in corresponding Japanese Patent Application No. 2004-356284 dated Jun. 29, 2010.

* cited by examiner

IMPRINTING MACHINE AND DEVICE MANUFACTURING METHOD

BACKGROUND OF THE INVENTION

The present invention relates to an imprinting machine that transfers a pattern of a mold onto an object.

The photolithography technology has conventionally been widespread as a fine processing technology in the semiconductor process. However, the photolithography requires a projection exposure step and a development step to transfer a desired shape onto the object.

The nanoimprint technology is proposed, for example, in U.S. Pat. Nos. 6,482,742 and 6,517,977, which presses or stamps a mold having a fine concave-convex pattern against an object or a substrate, thereby transferring the concave-convex pattern without the projection exposure or development step. Japanese Patent Application, Publication No. 2000-194142 discloses at paragraphs 0012-0020 and in FIGS. 1 and 2, etc., a transfer of a concave-convex pattern without strongly pressing the mold against the object.

This method applies liquid photopolymerizing resin onto a substrate of the object, and presses the mold against the photopolymerizing resin. Then, this method irradiates the light through the mold, cures the photopolymerizing resin, and transfers the concave-convex pattern of the mold. The mold is made, for example, of glass that allows the light to pass through the mold.

This method has advantages in that the mold does not have to be strongly pressed against the object and thus the mold and the object are less likely to get damaged, and the time period required for the pattern transfer is relatively short. This method is expected to transfer a pattern having a critical dimension ("CD") of several tens nanometers.

A step-and-flash transfer technology is proposed as an application of this method, which sequentially changes a pattern transfer position relative to the object.

The nanoimprint technology requires the mold and the object, such as a substrate, to be arranged in parallel. The non-parallel pattern transfer causes uneven transfer pressure and height, or damages of part of the mold due to a so-called end contact in which only one end of the mold contacts the substrate.

When the nanoimprint technology is used to manufacture a semiconductor chip, the mold size is as large as one chip or several millimeters square to several centimeters square. It is therefore very difficult to press such a sized mold against the object precisely while maintaining the mold and the object in parallel.

Usually, pattern transfers several times are necessary to manufacture the semiconductor chip, etc., and all the transfer patterns should be precisely overlaid. Therefore, a highly precise alignment between the mold and the substrate is necessary for each pattern transfer.

A conventional semiconductor exposure apparatus fixes a photomask having a pattern in place, and aligns the photomask with the object precisely by controlling a position of a fine movement stage on which the object is placed.

On the other hand, the nanoimprint technology brings the mold into contact with the object, and when the mold is being pressed against the object, for example, the mold is subject to a position shifting force in a direction horizontal to the direction in which the mold is pressed against the object. In addition, the end contact causes a deformation of the holding mechanism of the mold and a positional shift of the mold.

In other words, even a precise alignment between the mold and the object before the mold is pressed against the object does not guarantee that arrangement while the mold is actually being pressed against the object.

BRIEF SUMMARY OF THE INVENTION

The present invention is directed to an imprinting machine that enables a position of a mold to be confirmed when the mold contacts the object.

An imprinting machine according to one aspect of the present invention that brings a mold having a pattern into contact with an object and transfers the pattern onto the object includes a measurement unit that measures a position of the mold when the mold contacts the object.

A device manufacturing method according to another aspect of the present invention includes the steps of transferring a pattern of a mold onto an object by using the above imprinting machine, and etching the substrate. Claims for the device manufacturing method that exhibits operations similar to those of the above processing apparatus cover devices as their intermediate products and finished products. Such products include semiconductor chips, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Referring now to the accompanying drawings, a description will be given of preferred embodiments of the present invention.

First Embodiment

Figure 1:
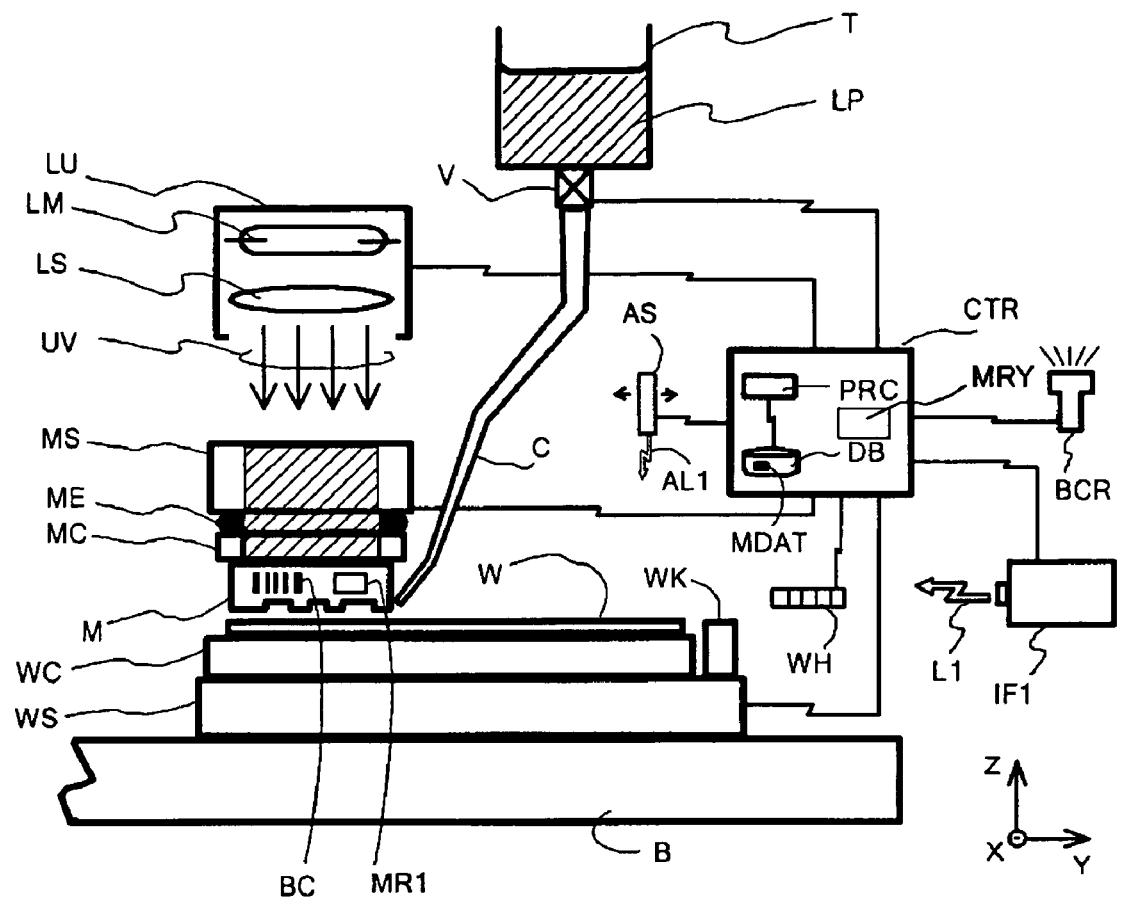
FIG. 1 is a schematic structure of a nanoimprint lithography apparatus according to a first embodiment of this invention.

FIG. 1 shows a structure of a nanoimprint apparatus (imprinting machine) according to a first embodiment of the present invention.

In FIG. 1, M denotes a mold having a fine concave-convex pattern on its bottom surface, and is held on a bottom of a mold chuck MC by a vacuum absorption or another method.

A mold stage MS is supported by a frame (not shown) of an apparatus body, and rotatable in XYZ-axes directions and rotational directions around these axes.

The mold stage MS and the mold chuck MC are connected to each other via a low elastic joint ME made of an elastic member. The low elastic joint ME acts as a spring member of a fine stroke, and elastically absorbs displacements and deformations. When the mold M end-contacts the wafer W, the low elastic joint ME deforms and alleviates the uneven pressure applied to the mold M.

The necessary stroke for the low elastic joint ME is so small that control over a shape, like a coil spring and a flat spring, has a difficulty to realize a desired performance. Therefore, the material itself has a much lower elasticity than the surrounding members, and it is preferable to elastically absorb the deformation and the displacement even if no specific feature is provided to the shape. Such a material includes, for example, β-titanium alloy having a body-centered cubic structure, such as rubber metal (trade name), which contains niobium, tantalum, vanadium, zirconium, hafnium, and oxygen.

The mold stage MS, the low elastic joint ME, and the mold chuck MC have a hollow structure so that they allows the light to pass from the top to the mold M.

The wafer W is held on a wafer chuck WC by a vacuum absorption or another method. The wafer stage WS is provided on a surface plate B, and rotatable in XYZ directions and rotating directions around these axes. The positioning precision of the wafer stage WS is enough for a minimum pattern to be transferred.

Provided on a wafer stage WS is a wafer stage reference mark table WK, which has plural optical marks that are approximately level with the wafer W, and necessary at the initial positioning time of the mold M etc. The wafer stage reference mark table WK preferably has a variable height.

The driving range of the wafer stage WS should be so wide that the wafer reference position mark table WK can oppose to the mold M in addition to the range corresponding to the entire surface of the wafer W.

T denotes a tank that stores photopolymerizing resin LP as resist for the object, and is connected to a channel C via a valve V. The channel C has an opening near the edge of the mold M.

LU denotes a light source unit, which includes a lamp LM and a lens LS, and generates the UV light for curing the photopolymerizing resin LP. The lamp LM turns on and off. The mold M is made of quartz glass, and passes the UV light.

BC denotes a barcode printed on a mold M, and MR1 denotes a mirror provided on a mold M. The barcode BC contains ID information for identifying the mold M. The barcode BC is read by a barcode reader BCR. Database DB stores mold intrinsic data MDAT corresponding to ID information of the mold M. The mold intrinsic data MDAT has read only data necessary for the pattern transfer, and transfer history data to be renewed after the pattern transfer. The barcode BC on the mold M enable the intrinsic information to the mold M to be easily controlled.

IF1 denotes an interferometer, and generates interference measuring light L1, which is to be reflected by the mirror MR1. Although FIG. 1 shows only the interferometer IF1 and the mirror MR1, a sufficient number of interferometers and mirrors are actually provided to recognize the position and orientation of the mold M.

CTR denotes a controller, which includes a processor PRC and a database DB, and is connected to each component in the apparatus. The processor PRC installs software necessary to control the entire apparatus.

AS denotes an alignment scope having a semiconductor laser and an observation optical system. The alignment scope AS measures the mold M in positioning the mold M in place on the apparatus, and measures an arrangement between the mold M and each shot position on the wafer W. The alignment scope AS is made movable by a driving mechanism supported on the frame of the apparatus body.

WH denotes a wafer height sensor that includes plural capacitance sensors, and measures a height distribution of the wafer W by scanning the entire surface of the wafer W.

Figure 2:
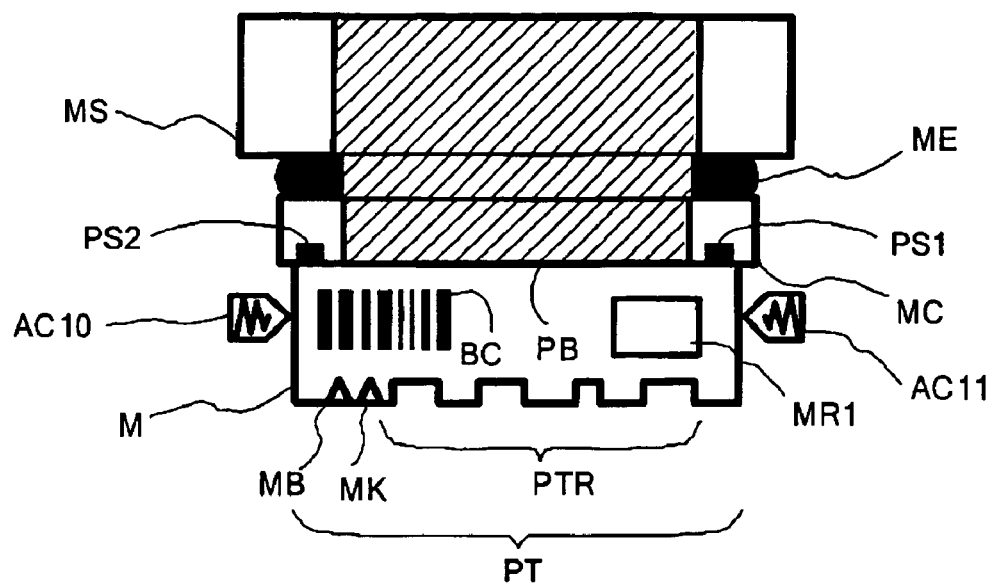
FIG. 2 is a detailed view around a mold stage of the first embodiment.

FIG. 2 is a detailed view around the mold M. As shown in FIG. 2, the bottom of the mold chuck MC has pressure sensor PS1 and PS2 that monitor the applied pressure when the mold M is pressed against the wafer W.

The photopolymerizing resin LP is inserted between the wafer W as a substrate and the mold M. The "mold M is pressed against the wafer W" in this embodiment means that the mold M is pressed against the wafer W although the mold M does not directly contact the wafer W.

A concave-convex pattern PTR, a mold reference position mark MB and a mold alignment mark MK are formed on a pattern surface PT as a bottom surface of the mold M.

The concave-convex pattern PTR has a pattern used to transfer the alignment mark necessary for the next and subsequent transfers onto the photopolymerizing resin LP on the wafer W.

AC10 and AC11 denote an auxiliary actuator that includes a piezoelectric element, and serves to supplement the driving force such that the driving force can exceed the friction force between the mold M and the wafer W while the mold M is being pressed against the wafer W, the mold stage MS is driven, and the mold M is driven in the XY directions, the driving force.

Figure 3:
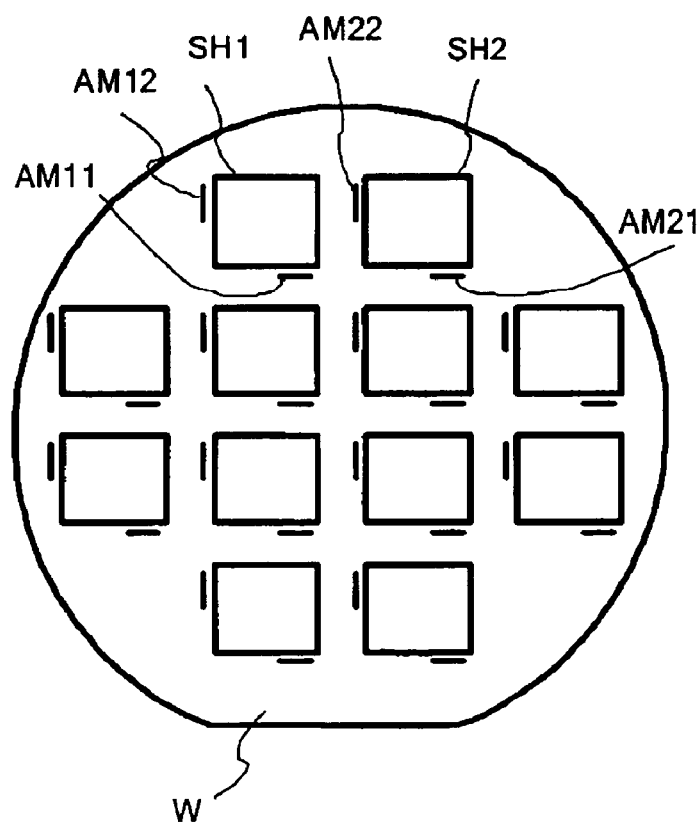
FIG. 3 is a view for explaining an arrangement of transfer shot positions on a wafer according to the first embodiment.

FIG. 3 shows a wafer W having some pattern-transferred shots by this apparatus. SH1 and SH2 denote arranged transfer shot positions through plural pattern transfers. Wafer alignment marks AM11 and AM12 are patterned next to the transfer shot potions by the previous nanoimprint or photolithography.

In loading the mold M to the apparatus, the barcode reader BCR reads the barcode BC, and the controller CTR extracts the mold intrinsic data MDAT corresponding to the ID information of the mold M among the database DB. The mold intrinsic data MDAT contains information relating to the concave-convex pattern of the mold M and other information. The controller CTR rewrites the ID information of the apparatus to the mold intrinsic data MDAT.

When the mold M is carried in the apparatus, it is held on the mold chuck MC. A reference alignment follows to align an optical mark on the wafer stage reference mark table WK shown in FIG. 1 with the mold reference position mark MB on the mold M, and to position the mold M in place on the apparatus. This alignment uses an alignment scope AS.

The wafer height sensor WH measures the height distribution of the wafer W, and the controller CTR presumes an inclination of each part on the wafer W based on the result. An inclination of the wafer W or mold M is adjusted based on the presumed inclination in the following pattern transfer.

The adjustment needs data relating to the parallelism between an attachment surface PB of the mold M and the pattern surface PT, and the value is contained in the mold intrinsic data MDAT.

A description will now be given of the pattern transfer procedure of the nanoimprint apparatus according to this embodiment. A description will now be given of the overview of the pattern transfer using the flowchart shown in FIG. 8. The controller CTR controls the procedure shown in the flowchart in accordance with a computer program.

Step (abbreviated as "S" in FIG. 8) 1 drives the wafer stage WS so that the mold M opposes to a vicinity of the target shot position or the next pattern transfer position on the wafer W.

Next, step 2 uses the alignment scope AS as a first measuring means to precisely arrange the target shot position opposite to the mold M.

Figure 4A:
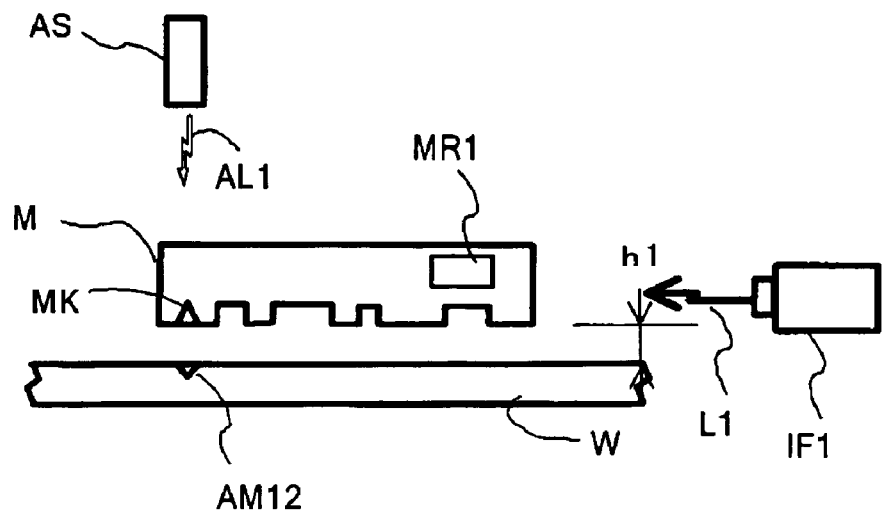
FIGS. 4AA, 4AB, 4AC, 4BD, 4BE, and 4BF are sectional view for explaining a pattern transfer procedure according to the first embodiment.
Figure 4A:
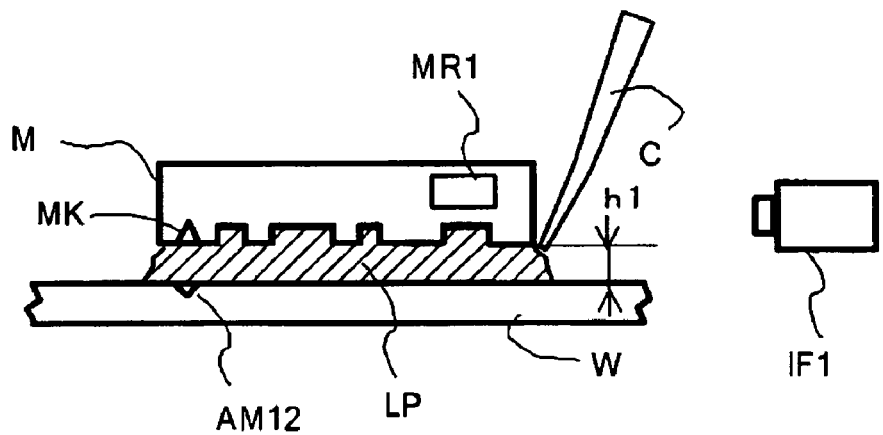
Figure 4A:
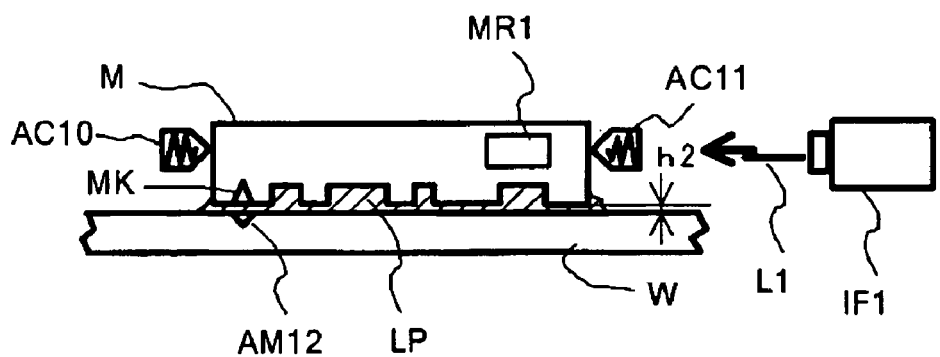

Next, step 3 introduces the photopolymerizing resin LP between the wafer W and the mold M. The introduced amount of the photopolymerizing resin LP depends upon the area of the pattern surface PT of the mold M. The photopolymerizing resin LP may be applied onto the wafer W in advance to step 2. As shown in FIGS. 4AA and 4AB, the distance between the wafer W and the mold M is maintained the first distance h1.

Next, step 4 approximately presses the mold M against wafer W. The term "approximately" means the minimum thickness of the photopolymerizing resin LP does not become zero between them.

Step 4 uses the interferometer IF1 as a second measuring means to measure a position of the mold in the XY directions or on the XY surface and the inclination of the mold M relative to the XY surface or the wafer W. The following embodiment collectively refers to these position and inclination as a "position" relating to the XY surface. This measurement corresponds to the measurement relating to the position of the mold M using the second measuring means. The auxiliary actuators AC10 and AC 11 are driven, if necessary, based on the measurement result, to correct the arrangement between the mold M and the wafer W and the parallelism (second alignment)

While this embodiment describes use of the interferometer IF1 as the second measuring means, the present invention may use another measuring means or an alignment scope similar to the first measuring means, as long as the arrangement between the mold M and the wafer W in the XY directions and the inclination with respect to the XY surface can be measured.

Next, step 5 irradiates the UV light from the light source unit LU to the photopolymerizing resin LP, thereby curing the photopolymerizing resin LP.

Next, step 6 separates the mold M from the wafer W (or the cured resin LP).

Next, step 7 determines whether the current shot is a final shot, and terminates the process when it is so. Otherwise, the procedure returns to step 1 and repeats for the next transfer shot.

Referring now to FIGS. 4AA to 4AC and 4BD to 4BF, a description will be given of the alignment method according to this embodiment. FIGS. 4AA to 4BF are sectional views showing a transfer procedure onto the transfer shot position SH1, and omit the mold stage MS and some other components.

FIG. 4AA shows a first alignment step. As illustrated, while the wafer W and the mold M are being separated from each other by a first distance, the alignment scope AS as the first measuring means observes the wafer alignment mark AM12 and the mold alignment mark MK. This observation measures the position of the mold M, more specifically, the arrangement between the mold M and the wafer W. The mold M is aligned with the wafer W through such control over the wafer stage WS that these two marks overlap each other. The first alignment means includes the alignment scope AS, the wafer stage WS, and the controller CTR that controls them.

The measurement is designed to be most precise when the distance between the mold alignment mark MK and the wafer alignment mark AM 12 is a first distance h1. At this time, the photopolymerizing resin LP has not yet been introduced onto the wafer W, and the mold M does not contact the photopolymerizing resin LP.

Although not illustrated, the actual first alignment observes at least another pair of a wafer alignment mark and a mold alignment mark for an alignment between the wafer W and the mold M.

The first alignment needs the positional information of the mold alignment mark MK based on the mold reference position mark MB, and the positional information is contained in the mold intrinsic data MDAT.

The above procedure is similar to the alignment in the proximity semiconductor exposure apparatus, which arranges the photomask opposite to the wafer with a small interval.

A supplemental description of the reference alignment that positions the mold M in place after it is carried into the apparatus, and the first alignment between the wafer alignment mark AM12 and the mold alignment mark MK.

Since these alignments need high precisions while two alignment marks are spaced from each other in a vertical direction, these alignments preferably use a diffraction grating for the alignment marks.

Use of the diffraction grating for the alignment mark is mainly studied in the alignment method for the X-ray proximity exposure, and disclosed in U.S. Pat. Nos. 5,000,573, 6,285,033 and 6,151,120.

In the reference alignment that positions the mold M in place in the apparatus, the alignment measurement light AL1 from the alignment scope AS travels through the mold M, and passes through the mold reference position mark MB. The alignment measurement light AL1 is then reflected on a mark (not shown) formed in place, and returns to the alignment scope AS through the mold reference position mark MB again.

Similarly, in the alignment between the wafer alignment mark AM12 and the mold alignment mark MK, the alignment measurement light AL1 from the alignment scope AS travels through the mold M, and passes the mold alignment mark MK. The alignment measurement light AL1 is then reflected on the wafer alignment mark AM12, and returns to the alignment scope AS through the mold alignment mark MK again. A position of the alignment scope AS is varied if necessary.

While this embodiment introduces the alignment measurement light AL1 perpendicular to the alignment mark, the alignment measuring light AL1 maybe incident obliquely upon the alignment mark for the measurement.

Thus, the alignment scope AS observes the wafer alignment mark AM12 and the mold alignment mark MK. The interferometer IF1 is activated while these marks overlap each other. Thereby, the interference measurement light L1 is reflected on the mirror MR1, and the distance to the mirror MR1 can be measured. Moreover, a similar result that uses another interferometer (not shown) and another mirror on the mold M may be used to calculate the position and inclination of the mold M and the position and the inclination are stored in the memory MRY (see FIG. 1) in the controller CTR.

The above operation needs the positional information of the mirror MR1 on the basis of the mold reference position mark MB, and the positional information is contained in the mold intrinsic data MDAT.

The optimal interval between the mold M and the wafer W to maximize the precision of the alignment depends upon a design of the alignment mark. Therefore, data indicative of a type of the mold alignment mark MK etc. is necessary, and this information is contained in the mold intrinsic data MDAT.

Figure 8:
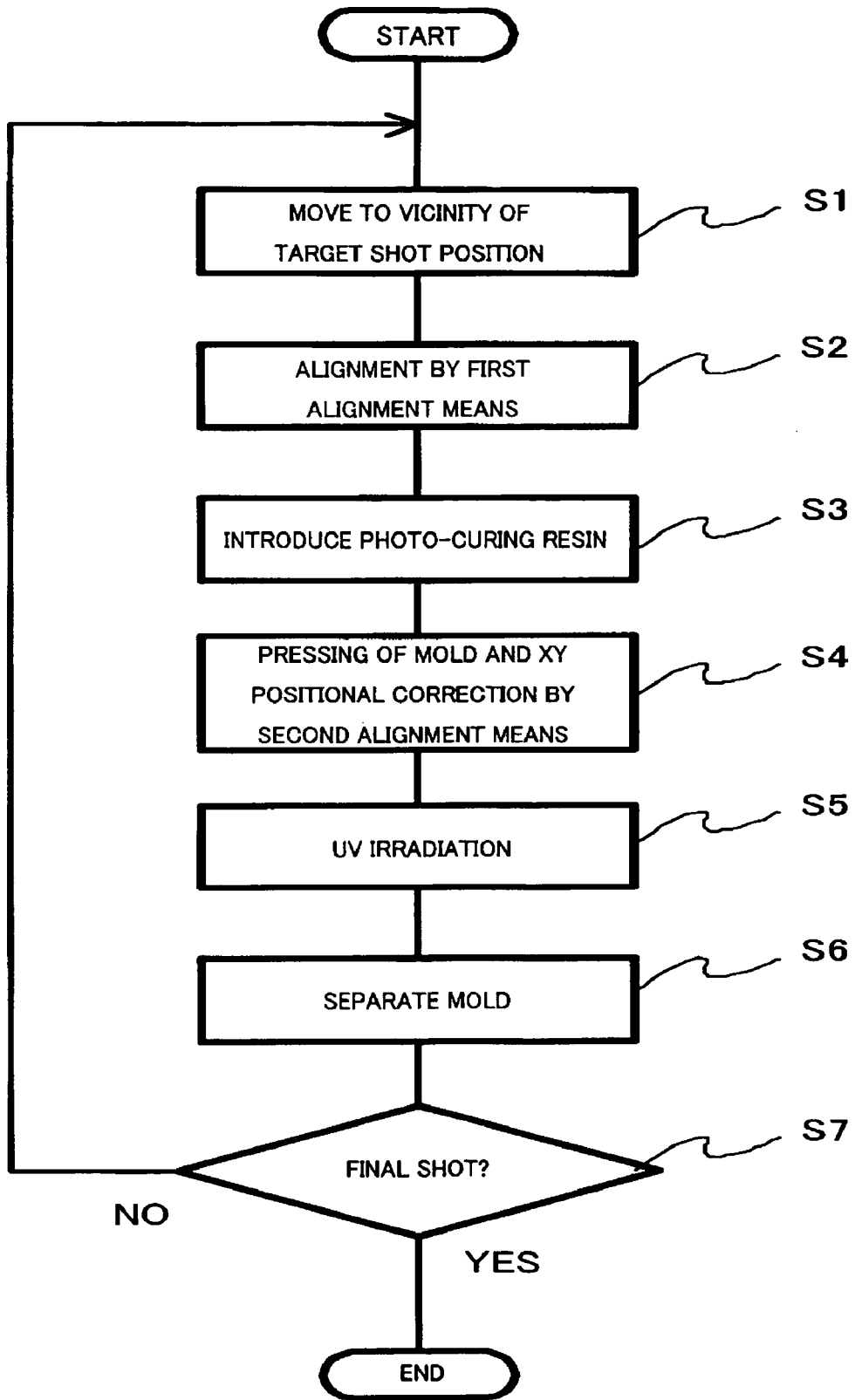
FIG. 8 is a flowchart for explaining an overview of the pattern transfer procedure of the first embodiment.

Next, as shown in FIG. 4AB, the photopolymerizing resin LP is introduced from the channel C to a space between the wafer W and the mold M (step 3 in FIG. 8). Thereby, the mold M contacts the photopolymerizing resin LP, although the distance between the mold M and the wafer W remains the first distance h1.

As described above, prior to the alignment between the alignment mark AM12 and the mold alignment mark MK, the photopolymerizing resin LP may be dropped on the wafer W at the current shot position. Then, a space between the wafer alignment mark AM 12 and the mold alignment mark MK is filled with the photopolymerizing resin LP instead of the air. Both alignment marks and the alignment scope AS must be designed by weighing the refractive index of the photopolymerizing resin LP.

Next, as shown in FIG. 4C, the mold M is pressed against the wafer W. Indeed, the distance between the mold M and the wafer W is set to a second distance h2 shorter than the first distance h1. In this state, the outputs of the pressure sensors PS1 and PS2 provided in the mold chuck MC are observed, and the pressing action ends when the pressure reaches a predetermined pressure.

The "predetermined pressure" depends upon the material of the mold M, the size of the pattern surface PT, and the height of the concave-convex pattern PTR in order to prevent damages of the mold M. The data is contained in the mold intrinsic data MDAT.

In pressing, the mold state MS may be driven toward the wafer W, or the wafer stage WS may be driven toward the mold M.

Even when the mold M is pressed against the wafer W while the mold M is inclined relative to the wafer W, the low elastic joint ME disperses the pressure caused by the end contact, preventing the damages of the mold M.

The second alignment step follows in the state shown in FIG. 4AC. The interferometer IF1 and the other interferometer (not shown) as the second measuring means are operated to calculate the current position of the mold M. Then, the position is compared with the stored position that has been measured prior to the pressing shown in FIG. 4AA (or before the photopolymerizing resin LP is introduced). A positional correction is provided for any positional shift in the XY directions by driving the mold stage MS and by moving the mold M in a direction reducing the positional shift. The second alignment means includes the interferometer IF1, the mirror MR1, the mold stage MS and the controller CTR that controls them.

An equivalent correction in the second alignment is available by driving the wafer stage WS instead of and/or together with the mold stage MS.

When the driving force of the mold stage MS runs short, the auxiliary actuator AC10 and AC11 may be driven.

The above pressing and position correcting processes will be complemented. Step 4 in FIG. 8 executes the pressing and position correcting processes, and FIG. 9 shows a flowchart that explains in detail the contents of the processes in step 4.

Figure 9:
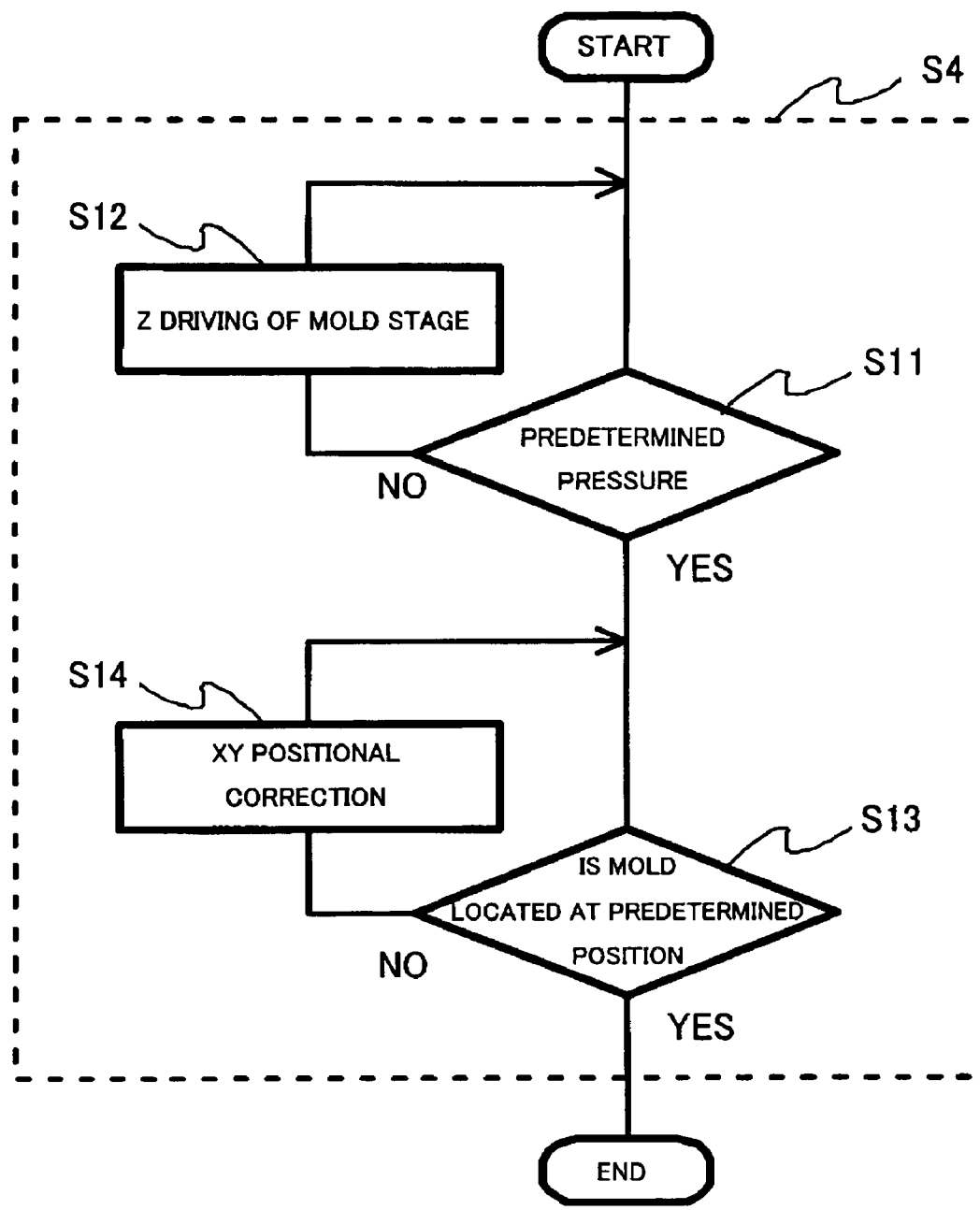
FIG. 9 is a flowchart for explaining a processing example of step 4 in FIG. 8.

Step 11 in FIG. 9 determines whether the pressure of the mold M reaches the predetermined pressure. If so, the procedure moves to step 13. If not, the procedure moves to step 12.

Step 12 drives the mold stage MS in the Z direction, whereby the mold M approaches to the wafer W from the position of the first distance h1 to the position of the second distance h2. Then, the procedure returns to step 11.

Step 13 compares the current position of the mold M measured by the interferometer IF1, etc. with the position stored in the memory MRY which has been measured prior to pressing, as described above, and determines whether the mold M is located at the predetermined or pre-pressed position. When it is located at the predetermined position, the procedure ends. When it is not, the procedure moves to step 14.

Step 14 drives the mold stage MS and corrects the position of the mold M. Then, the procedure returns to step 13.

This embodiment describes the positional correction of the mold M after the mold M is pressed against the wafer W. However, in the pressing action or when the mold M moves from the position of the first distance h1 to the position to the second distance, the interferometer IF1 etc. continuously measure and the position of the mold M may be corrected in the pressing action. When the positional correction follows pressing of the mold M against the wafer W, the mold alignment mark MK and the wafer alignment mark AM12 separate from each other when a large positional shift of the mold M occurs due to the pressing, causing an insufficient positional correction. The positional correction simultaneous with the pressing action solves this problem.

Figure 10:
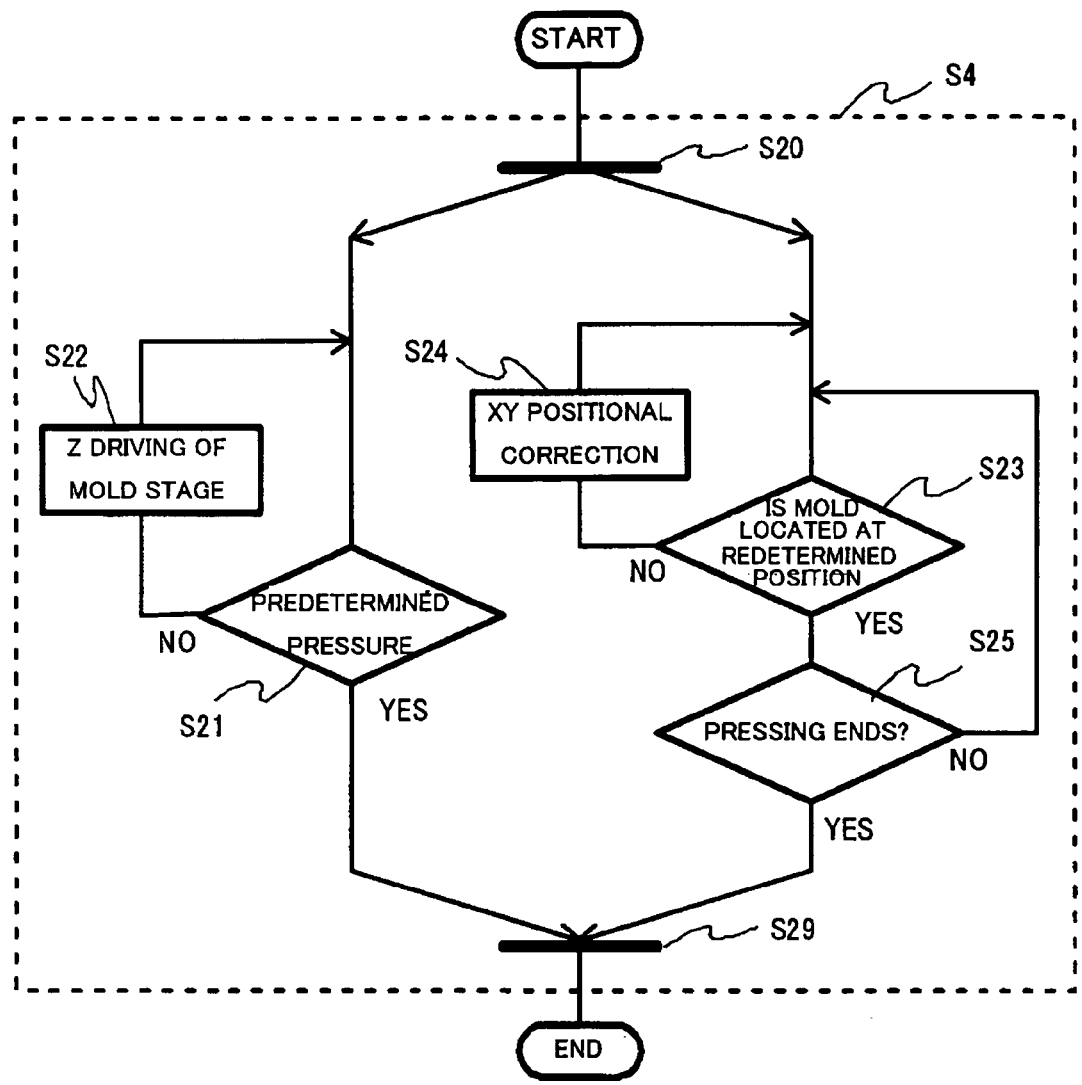
FIG. 10 is a flowchart for explaining another processing example of step 4 in FIG. 8.

Referring to a flowchart shown in FIG. 10, a supplemental description will be given of the pressing and position correcting processes in this case. Step 4 in the flowchart shown in FIG. 8 also conducts the pressing and position correcting processes.

When the process starts, step 20 is split into steps 21 and 23. These steps conduct processes approximately simultaneously.

Step 21 determines whether the pressure of the mold M reaches the predetermined pressure. If so, the procedure moves to step 29. If not, the procedure moves to step 22.

Step 22 drives the mold stage MS in the Z direction, and moves the mold M close to the wafer W. Then, the procedure returns to step 21.

Step 23 compares the current position of the mold M measured by the interferometer IF1 etc., with the position stored in the memory MRY which has been measured before pressing. Then, Step 23 determines whether the mold M is located at the predetermined or pre-pressed position. When it is located at the predetermined position, the process ends, and the procedure moves to step 25. When it is not, the procedure moves to step 24.

Step 25 determines whether the simultaneous pressing process ends. If it ends, the procedure moves the step 29. If not, the procedure moves the step 23.

Step 24 drives the mold stage MS, corrects the position of the mold M, and returns to step 23.

Step 29 confirms that the split two processes end, and terminates the whole process.

Figure 4B:
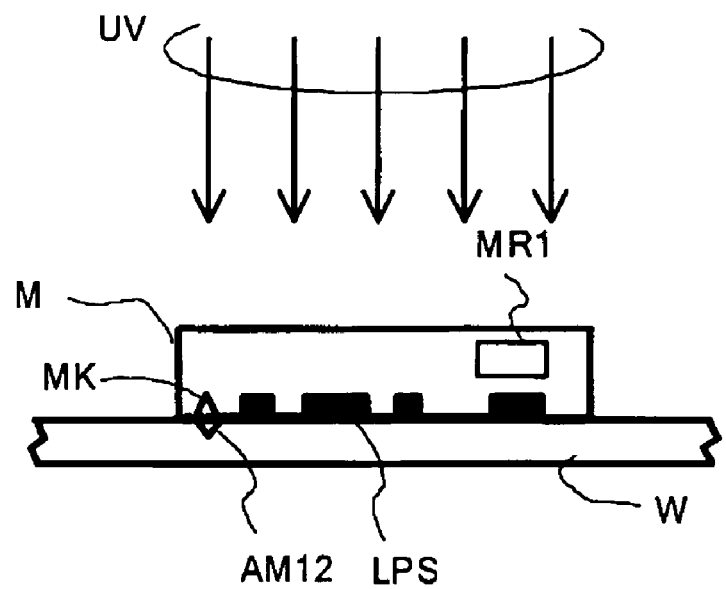
Figure 4B:
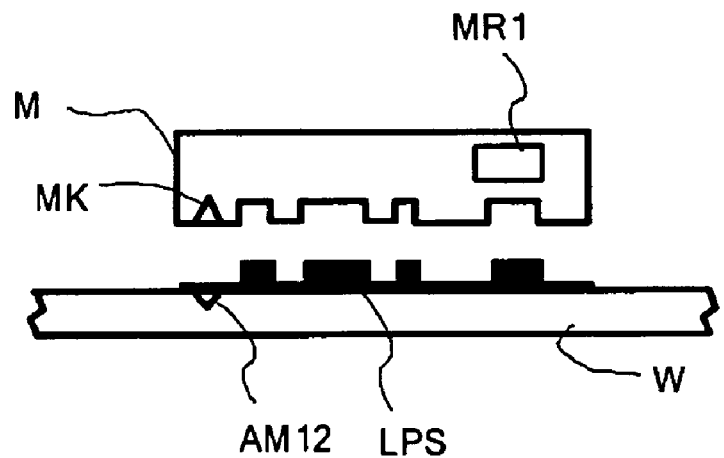
Figure 4B:
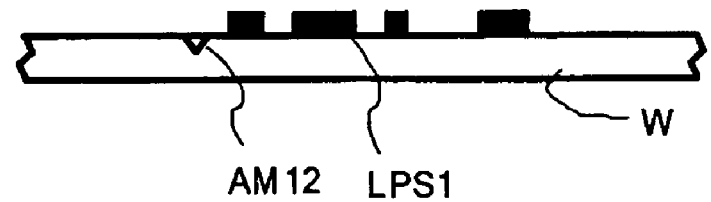

When the second alignment ends in the state shown in FIG. 4AC, the light source unit LU (see FIG. 1) irradiates the UV light for a predetermined time period, as shown in FIG. 4BD, curing the photopolymerizing resin LP. LPS denotes the cured resin.

A determination of the above "predetermined time period" depends upon the transmittance of the mold M, and the value is contained in the mold intrinsic data MDAT. The "predetermined time period" may be calculated from the material and thickness of the mold M, and the value of the thickness of the mold M is contained in the mold intrinsic data MDAT.

Next, as shown in FIG. 4BE, the mold M is separated from the wafer W (cured resin LPS), 1 is added to a value indicative of the number of uses of the mold M in the mold intrinsic data MDAT, and the pattern transfer ends in the transfer shot SH1.

By repeating the above operation for all the transfer shots, the pattern PTR of the mold M can be transferred onto approximately the entire surface of the wafer W.

An unnecessary layer of cured resin LPS remains on the wafer W separated from the mold M in FIG. 4BE. The etching process follows for the entire surface of the wafer W after the pattern is transferred onto all the transfer shots. By removing the remaining, disused cured resin layer, the resin pattern LPS1 can be obtained at the necessary portion, as shown in FIG. 4BF.

A circuit pattern is formed on the wafer W by using the obtained photopolymerizing resin pattern LPS1 as a resist layer, and by etching the wafer W, etc., similar to the conventional semiconductor manufacturing process. The CD of the circuit pattern is 100 nm or smaller, down to the level of 10 nm.

As described previously, the alignment mark necessary for the next and subsequent pattern transfers can be transferred by the mold M. the overlay accuracy of plural patterns can be maintained for the semiconductor manufacture. Therefore, the nanoimprint apparatus of this embodiment is applicable to the semiconductor manufacture.

The above description detects accordance between the alignment marks formed on both the mold M and the wafer W for each transfer shot. This method is known as a die-by-die alignment with a high precision, but has a difficulty in improving the transfer throughput.

More recently, a reduction projection type proximity semiconductor exposure apparatus has often used a global alignment method. The nanoimprint apparatus can improve the throughput by using the global alignment.

A description will now be given of the global alignment method applied to the nanoimprint apparatus of this embodiment.

According to this method, the database DB stores a predefined, ideal transfer shot positions and the wafer alignment mark positions. Prior to the actual transfer, the alignment measurement that is described with reference to FIG. 4AA is made for several transfer shots on the wafer W. The actual positions of all the transfer shots are presumed by comparing the information of the several actual transfer shots with the information of the predefined, ideal transfer shot positions.

Figure 11:
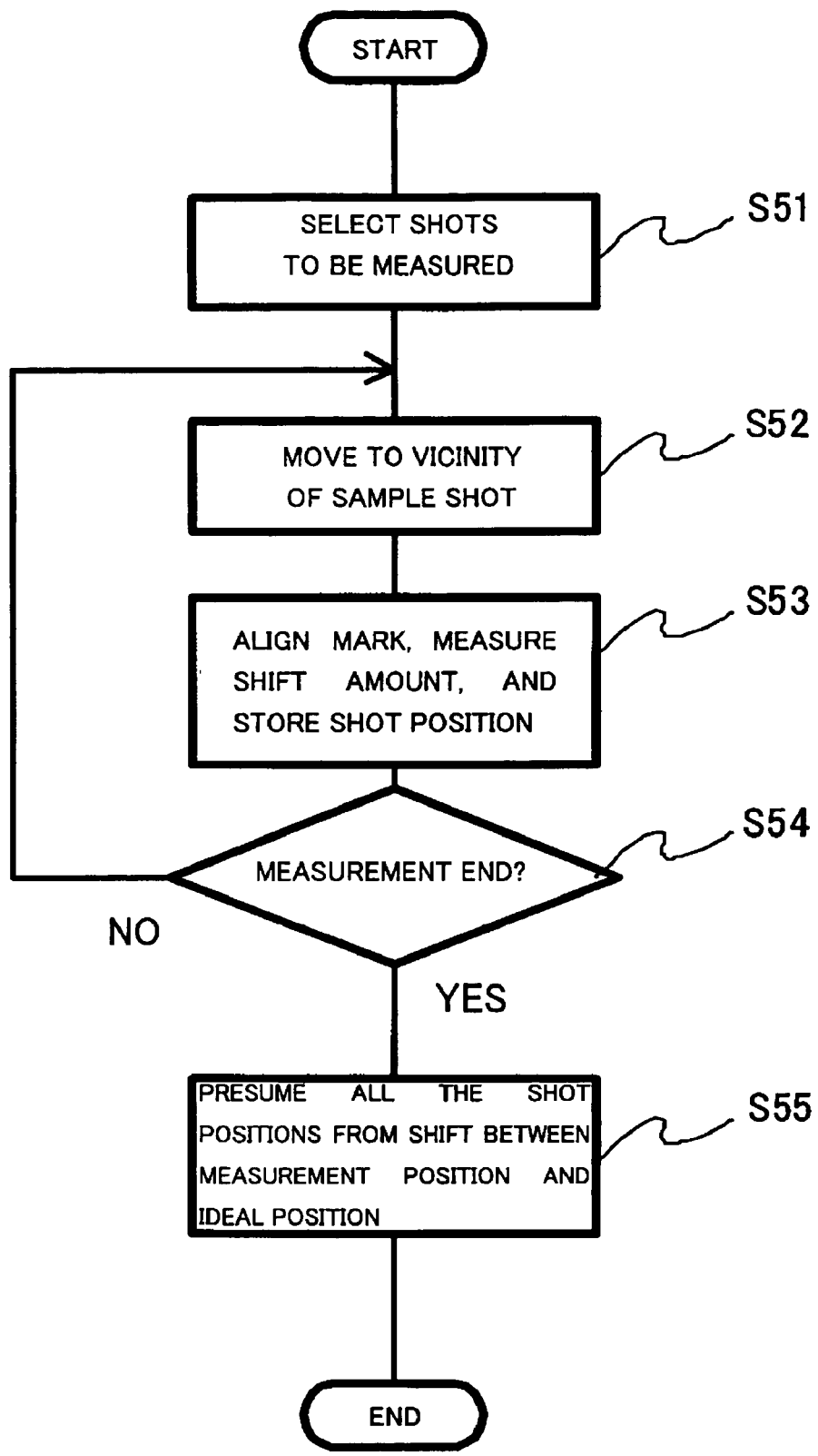
FIG. 11 is a flowchart for explaining an overview of a global alignment.

Referring now to a flowchart shown in FIG. 11, a supplemental description will be given of the global alignment. First, step 51 selects some transfer or sample shot positions as measurement objects. The transfer shot positions as measurement objects are predetermined, and the database DB may store their ID numbers.

Step 52 drives the wafer stage Ws, and moves the mold M close to one of the sample shot positions.

Step 53 aligns the mold alignment mark MK with the wafer alignment mark AM12. The sample shot position is calculated from the positions of the mold stage MS and the wafer stage WS, and stored in the memory MRY in the controller CTR.

The above alignment measurement that uses the diffraction grating recognizes an absolute amount of a shift between the alignment objects. Therefore, even when the mold alignment mark MK is not aligned with the wafer alignment mark AM12, the shift amount between them provides the sample shot positions.

Step 54 determines whether all the sample shots are measured. If so, the procedure moves to step 55. If not, the procedure returns to step 52 to measure the next sample shot position.

Step 55 presumes all the transfer shot positions from the information of all stored sample shot positions and the information of the predefined, ideal transfer shot positions, and ends the procedure.

Then, the mold M is directly moved to a presumed transfer shot position. The above various processes are conducted at the transfer shot position, such as interference measurement using the mirror MR1 and the interferometer IF1, the introduction of the photopolymerizing resin LP, and the UV light irradiation, thereby transferring the concave-convex pattern PTR at a high throughput.

Second Embodiment

Figure 5A:
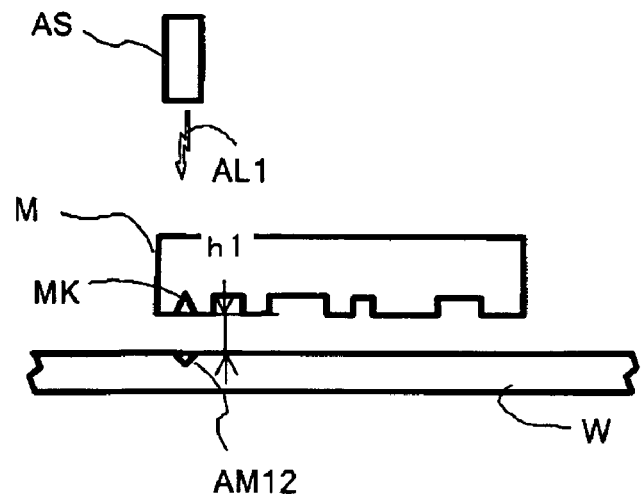
FIGS. 5A to 5C are sectional views for explaining a pattern transfer procedure according to a second embodiment of the present invention.
Figure 5B:
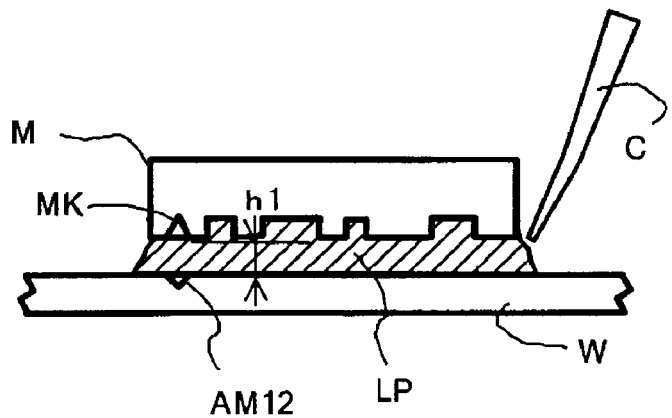
Figure 5C:
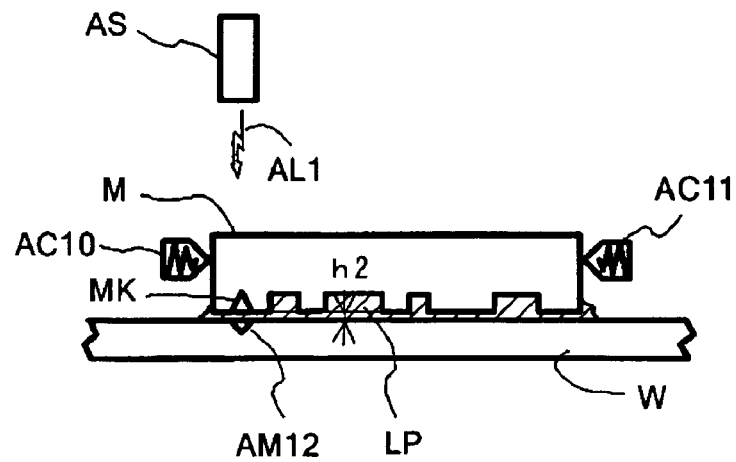

While the first embodiment describes the nanoimprint apparatus that uses, as a second measuring means, an interferometer and a mirror provided in the mold M, this embodiment describes a nanoimprint apparatus that uses, as a second measuring means, a component other than the interferometer, with reference to FIGS. 5A to 5C.

FIGS. 5A to 5C show a pattern transferring procedure similar to that shown in FIGS. 4AA to 4BF in the first embodiment, but are different from the first embodiment in that there is no interferometer and the mold M has no mirror.

In FIGS. 5A to 5C, the mold alignment mark MK and the wafer alignment mark AM 12 are made of a diffraction grating similar to the first embodiment. However, the alignment measurement is designed to be most precise when both alignment marks MK and AM12 are adhered to each other, or when the mold M is pressed against the wafer W.

Figure 7A:
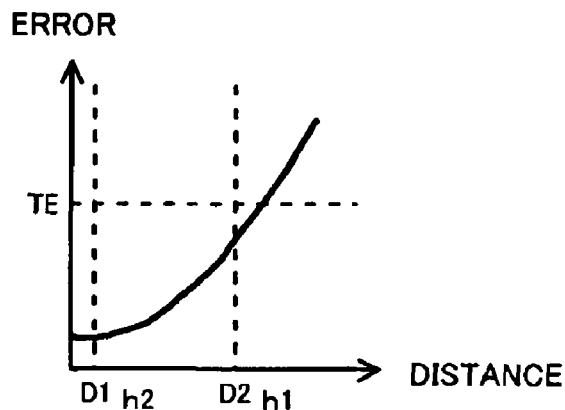
FIGS. 7A to 7C are views for explaining a relationship between a distance between alignment marks and an alignment measurement error in the second and third embodiments.

FIG. 7A shows a relationship of this embodiment between the alignment measurement error of a combination of the mold alignment mark MK and the wafer alignment mark AM12 and the distance in the Z or perpendicular direction between both the alignment marks. In the overall range of the distance between both the alignment marks MK and AM12, a value of the alignment measurement error must be a predefined permissible error TE or smaller. The second distance h2 is a distance between the alignment marks MK and AM12, as shown in FIG. 5C, when the mold M and the wafer W are approximately adhered to each other. The first distance h1 is a distance between the alignment marks MK and AM12, as shown in FIG. 5A, for an alignment before the mold M is pressed against the wafer W. As shown in FIG. 7A, when the distance between both the alignment marks MK and AM12 is the second distance h2, the value of the alignment measurement error becomes minimum.

First, as shown in FIG. 5A, the alignment scope AS irradiates the alignment measurement light AL1 from the mold alignment mark MK to the wafer alignment mark AM12 while the distance between the mold M and the wafer W is maintained the first distance h1. Then, an observation or measurement of the alignment state follows. Next, the mold stage MS or the wafer stage WS is driven so that the mold alignment mark MK overlaps the wafer alignment mark AM12.

Next, as shown in FIG. 5B, the photopolymerizing resin LP is introduced between the mold M and the wafer W, similar to the first embodiment.

Next, as shown in FIG. 5C, the mold M or wafer W is moved vertically and the mold M is pressed against the wafer W at a predetermined pressure.

The alignment state between the alignment mark MK and the wafer alignment mark AM12 is measured by irradiating the alignment measurement light AL1 from the alignment scope AS. The mold M is positioned in place on the wafer by driving the mold stage MS or the wafer stage WS (and if necessary by driving the auxiliary actuators AC10 and AC11).

This embodiment designs the alignment to be most precise when both the alignment marks MK and AM12 are approximately adhered to each other. Therefore, the alignment measurement at the state shown in FIG. 5C is more precise than that at the state shown in FIG. 5A, and easily provides a desired alignment precision.

The procedure of the UV light irradiation to cure the resin LP in this embodiment is similar to that described with reference to FIGS. 4BB to 4BF in the first embodiment.

This embodiment may also apply the global alignment to the alignment at the state that spaces the mold M from the wafer W by the first distance h1, similar to the first embodiment.

Similar to the first embodiment, this embodiment may provide an alignment between the mold alignment mark MK (mold M) and the wafer alignment mark AM12 (wafer W) while the mold M is being pressed against the wafer W.

Thus, this embodiment can realize highly precise pattern transfer with a simpler structure than the structure of the first embodiment.

Third Embodiment

Figure 6A:
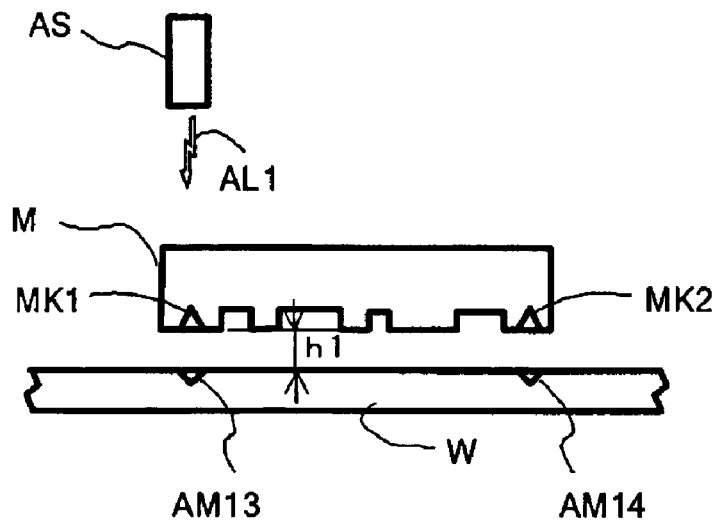
FIGS. 6A to 6C are sectional views for explaining a pattern transfer procedure according to a third embodiment of the present invention.
Figure 6B:
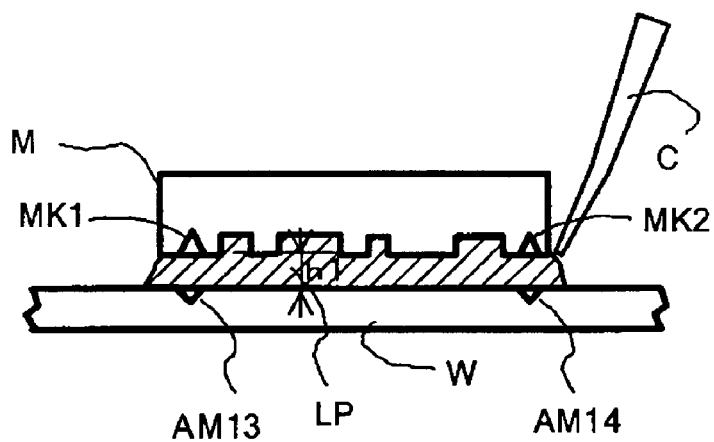
Figure 6C:
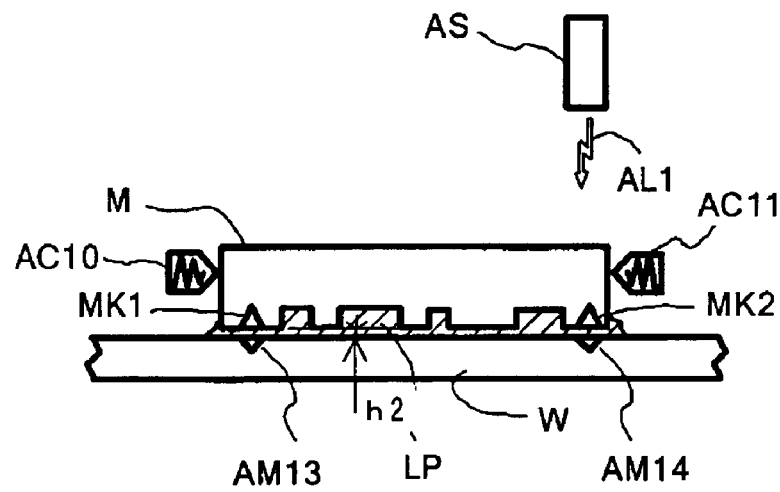

FIGS. 6A to 6C show a pattern transferring procedure in a nanoimprint apparatus according to a third embodiment of the present invention, which is similar to that shown in FIGS. 5A to 5C in the second embodiment, but is different from the second embodiment in that an alignment mark is added to each of the mold M and the wafer W.

Figure 7B:
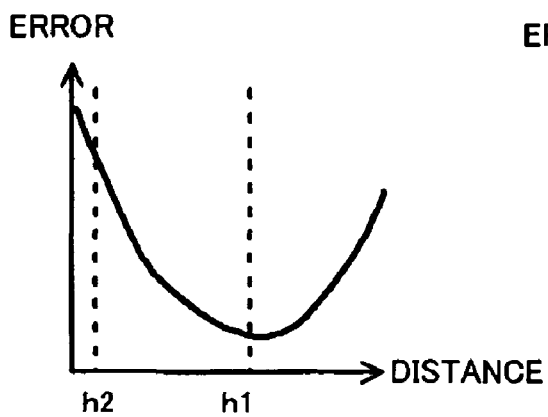
Figure 7C:
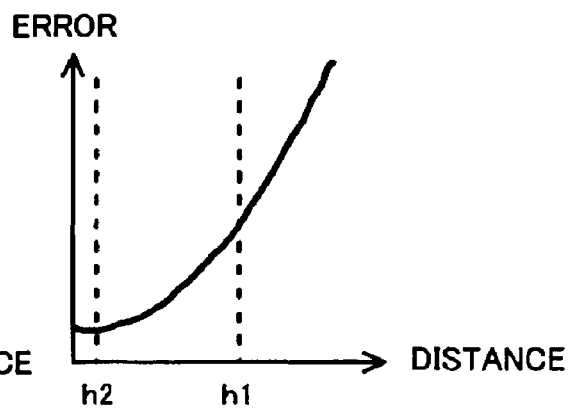

In FIGS. 6A to 6C, the mold alignment marks MK1 and MK2 and the wafer alignment mark AM13 and AM14 are made of a diffraction grating similar to the first and second embodiments. However, the alignment measurement is designed to be most precise when the mold alignment mark MK1 and the corresponding wafer alignment mark AM13 are spaced from each other by the first distance h1, and the mold alignment mark MK2 and the corresponding wafer alignment mark AM14 are adhered to each other or spaced from each other by the distance h2. FIGS. 7B and 7C show this state.

FIG. 7B shows a relationship between the alignment measurement error of a combination of the mold alignment mark MK1 and the wafer alignment mark AM13 and the distance in the Z or perpendicular direction between both the alignment marks MK1 and AM13. Similarly, FIG. 7C shows a relationship between the alignment measurement error of a combination of the mold alignment mark MK2 and the wafer alignment mark AM14 and the distance in the Z or perpendicular direction between both the alignment marks MK2 and AM14.

As to the combination between the mold alignment mark MK1 and the wafer alignment mark AM13, it is sufficient that the high precision is obtained near an actually used distance between these alignment marks. In other words, the precision for other distances may be outside the permissible range, unlike the second embodiment shown in FIG. 5. This is similar to the measurement precision of a combination between the mold alignment mark MK2 and the wafer alignment mark AM14.

First, as shown in FIG. 6A, an observation or measurement of the alignment state is measured by the alignment scope AS irradiates the alignment measurement light AL1 for the mold alignment mark MK1 and the wafer alignment mark AM13 while the distance between the mold M and the wafer W is maintained the first distance h1. Next, the mold stage MS or the wafer stage WS is driven so that the mold alignment mark MK1 overlaps the wafer alignment mark AM13.

Next, as shown in FIG. 6B, the photopolymerizing resin LP is introduced between the mold M and the wafer W, similar to the first and second embodiments.

Next, as shown in FIG. 6C, the mold M or wafer W is moved vertically and the mold M is pressed against the wafer W at a predetermined pressure.

After the alignment scope AS is moved to the side of the mold alignment mark MK2, the alignment state between the mold alignment mark MK2 and the wafer alignment mark AM14 is measured by irradiating the alignment measurement light AL1 from the alignment scope AS. The mold M is positioned in place on the wafer W by driving the mold stage MS or the wafer stage WS (and if necessary by driving the auxiliary actuators AC10 and AC11).

The procedure of the UV light irradiation to cure the resin LP in this embodiment is similar to that described with reference to FIGS. 4BB to 4BF in the first embodiment.

This embodiment may also apply the global alignment to the alignment at the state that spaces the mold M from the wafer W by the first distance h1, similar to the first embodiment.

Similar to the first embodiment, this embodiment may provide an alignment between the mold alignment mark MK2 (mold M) and the wafer alignment mark AM14 (wafer W) while the mold M is being pressed against the wafer W.

Thus, this embodiment can realize highly precise pattern transfer with a simpler structure than the structure of the first embodiment. However, this embodiment executes an alignment by varying a distance between the mold M and the wafer W, and it is necessary to design an alignment mark that provides a high measurement precision in a wide distance range.

As discussed above, this embodiment provides a highly precise alignment with a simple structure by varying a used alignment mark in accordance with a distance between the mold M and the wafer W.

While the nanoimprint apparatus in the first embodiment stores the mold intrinsic data MDAT in the database DB, an alternate storing means may be used. For example, a radio tag attached to the mold M stores the mold intrinsic data, and a controller CTR controls a transmitter-receiver that reads and writes data on the radio tag in a non-contact manner.

Preferably, the mold intrinsic data MDAT contains the mold ID information to facilitate the identification of the mold.

The controller CTR does not necessary control the transmitter-receiver and, for example, a host computer connected to a network may control the transmitter-receiver and receive the mold intrinsic data MDAT through the network.

Since all of the above embodiments use the photopolymerizing resin for the object to be transferred, the mold M should be transparent. However, the present invention is not limited to these embodiments. For example, the present invention is applicable to a nanoimprint apparatus that presses a mold made of a stronger material than glass, such as metal, against an object to be processed, such as heated and softened thermoplastic resin, and provides a plastic deformation of the object to be processed.

This embodiment attaches a transparent member to a side surface of the mold, and provides the transparent member with an alignment mark for an alignment in a similar procedure to each of the above embodiments. Alternatively, part of the mold may be made of a transparent material so that the part perforates the mold vertically, and the alignment mark may be provided to the transparent material.

Fourth Embodiment

Figure 12:
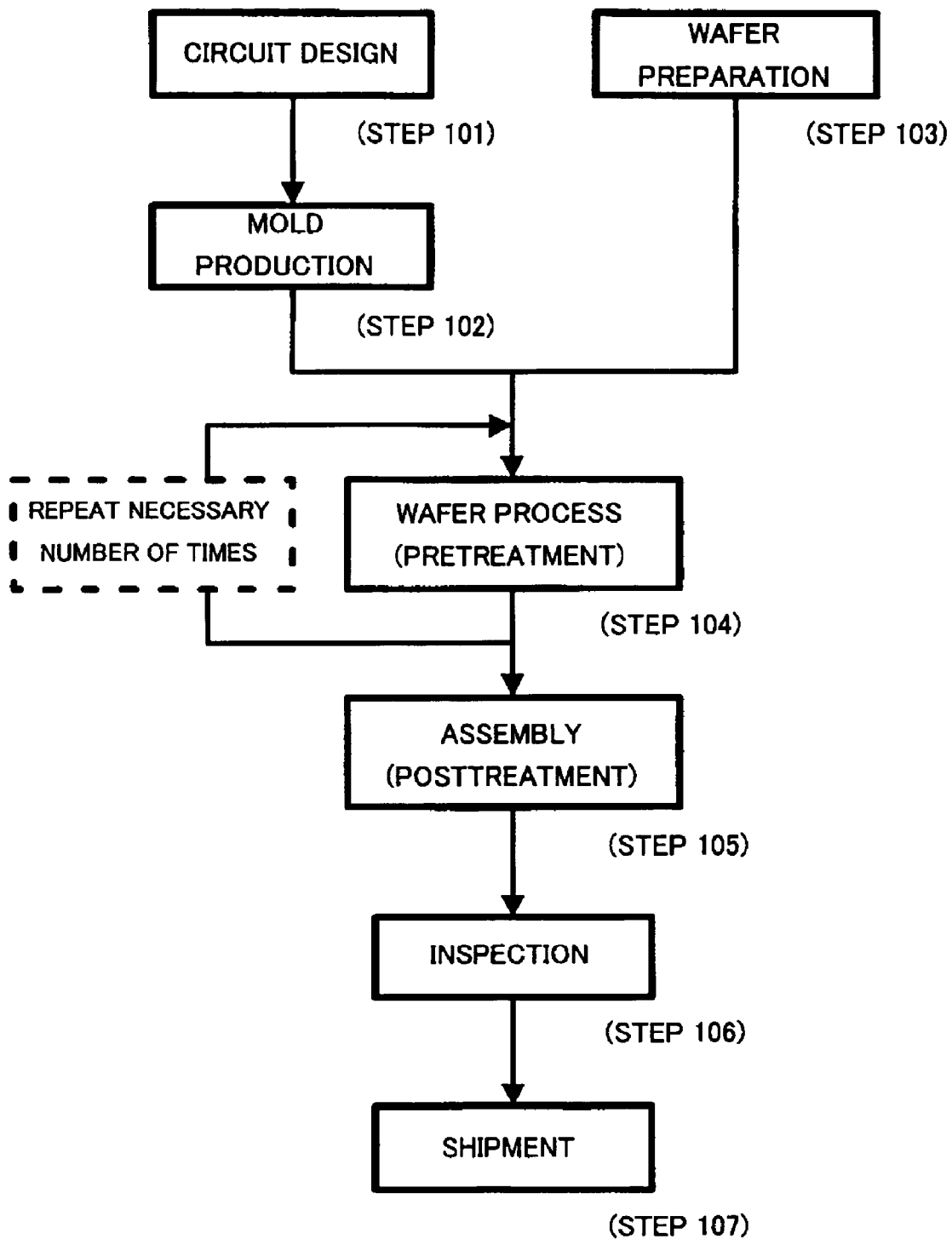
FIG. 12 is a flowchart for explaining a semiconductor device manufacturing process according to a fourth embodiment of the present invention.

Referring now to a flowchart shown in FIG. 12, a description will be given of a semiconductor device manufacturing process using the above nanoimprint apparatus of each embodiment. Step 101 (circuit design) designs a semiconductor device circuit. Step 102 (mold fabrication) forms a necessary number of molds for the circuit designed by step 101. Step 103 (wafer preparation) manufactures a wafer using materials such as silicon.

Step 104 (wafer process), which is also referred to as a pretreatment, forms actual circuitry on the wafer through the nanoimprint apparatus of each embodiment using the mold and wafer. Step 105 (assembly), which is also referred to as a post-treatment, forms into a semiconductor chip the wafer formed in Step 104 and includes an assembly step (dicing and bonding), a packaging step (chip sealing), and the like.

Step 106 (inspection) performs various tests for the semiconductor device made in Step 105, such as a validity test and a durability test. Through these steps, a semiconductor device is finished and shipped (Step 107).

Step 104 includes steps of oxidation that oxidizes the wafer's surface, CVD that forms an insulating film on the wafer's surface, an electrode formation that forms electrodes on the wafer by vapor disposition and the like, an ion implantation that implants ions into the wafer, a resist process that applies the photopolymerizing resin onto the wafer, a transfer that uses the nanoimprint apparatus to transfer the circuit pattern onto the wafer that has experienced the resist process step, etching that removes the photopolymerizing resin from part except the transfer pattern on the wafer processed by the transfer step, resist stripping that removes disused resist. These steps are repeated, and multi-layer circuit patterns are formed on the wafer. The device manufacturing method of this embodiment uses the photo-curing method and maintains the high overlay accuracy.

The device manufacturing method can manufacture higher quality devices than the conventional using the nanoimprint technology.

Further, the present invention is not limited to these preferred embodiments, and various variations and modifications may be made without departing from the scope of the present invention.

This application claims a benefit of priority based on Japanese Patent Application No. 2004-356284, filed on Dec. 9, 2004, which is hereby incorporated by reference herein in its entirety as if fully set forth herein.

What is claimed is:

1. An imprinting machine that brings a mold with a pattern surface having a pattern into contact with an uncured resin on an object and forms a pattern of a cured resin on the object, said imprinting machine comprising:
   a first measurement device including an optical system and configured to perform a first measurement of a position of an alignment mark formed on the object relative to an alignment mark formed on the pattern surface via said optical system;
   a second measurement device configured to perform a second measurement of a position of the mold by measuring a position of a surface of the mold other than the pattern surface;
   a mold stage configured to hold the mold and to be moved;
   an object stage configured to hold the object and to be moved; and
   a controller configured to cause said first measurement device to perform the first measurement before the mold and the uncured resin contact with each other, to cause said mold stage and said object stage to be moved relatively such that the mold and the object are aligned based on the first measurement before the mold and the uncured resin contact with each other, to cause said second measurement device to perform the second measurement after the mold and the object are aligned, to store a position of the mold obtained by said second measurement device, to cause said mold stage and said object stage to be moved relatively such that the mold and the uncured resin contact with each other, to cause said second measurement device to perform the second measurement again while the mold and the uncured resin contact with each other, and to cause said mold stage and said object stage to be moved relatively such that the mold and the object are aligned based on comparison of a position of the mold obtained by said second measurement device while the mold and the uncured resin contact with each other and the stored position of the mold.

2. An imprinting machine according to claim 1, wherein said controller is configured to cause said mold stage to be moved from a first position at which a distance between the mold and the object is a first distance, to a second position at which a distance between the mold and the object is a second distance shorter than the first distance, and to cause said second measurement device to perform the second measurement while said mold stage is at the second position.

3. An imprinting machine according to claim 1, wherein said controller is configured to cause said mold stage to move from a first position at which a distance between the mold and the object is a first distance, to a second position at which a distance between the mold and the object is a second distance shorter than the first distance, and to cause said second measurement device to perform the second measurement while said mold stage is moving from the first position to the second position.

4. An imprinting machine according to claim 1, wherein said second measurement device includes an interferometer.

5. An imprinting machine according to claim 1, wherein said mold stage includes an elastic member and is configured to hold the mold via the elastic member.

* * * * *